(12) United States Patent
Roberts et al.

(10) Patent No.: US 7,083,896 B2
(45) Date of Patent: *Aug. 1, 2006

(54) HIGHLY REFLECTIVE SUBSTRATES FOR THE DIGITAL PROCESSING OF PHOTOPOLYMER PRINTING PLATES

(75) Inventors: David Roberts, Carlsbed, CA (US); Geoffrey Yuxin Hu, San Diego, CA (US)

(73) Assignee: Napp Systems, Inc., San Marcos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/267,435

(22) Filed: Nov. 4, 2005

(65) Prior Publication Data

US 2006/0057499 A1      Mar. 16, 2006

Related U.S. Application Data

(63) Continuation of application No. 10/462,977, filed on Jun. 16, 2003, now Pat. No. 7,005,232.

(51) Int. Cl.
  *G03F 7/11*   (2006.01)
  *G03F 7/09*   (2006.01)
  *G03F 7/14*   (2006.01)

(52) U.S. Cl. ........................ 430/306; 430/395; 430/494

(58) Field of Classification Search ............. 430/270.1, 430/271.1, 273.1, 275.1, 276.1, 272.1, 278.1, 430/279.1, 302, 306, 307, 395, 281.1, 286.1, 430/494, 944; 101/453, 454, 463.1, 395
See application file for complete search history.

(56) References Cited

U.S. PATENT DOCUMENTS

| 3,836,709 | A | 9/1974 | Hutchison |
| 3,858,510 | A | 1/1975 | Kai et al. |
| 4,423,135 | A | 12/1983 | Chen et al. |
| 5,035,981 | A | 7/1991 | Kurtz et al. |
| 5,334,486 | A | 8/1994 | Abe et al. |
| 5,649,486 | A | 7/1997 | Lewis |
| 6,387,595 | B1 | 5/2002 | Teng |
| 7,005,232 | B1* | 2/2006 | Roberts et al. .......... 430/276.1 |
| 2002/0121206 | A1 | 9/2002 | Ooishi |
| 2003/0049564 | A1 | 3/2003 | Higashi et al. |
| 2004/0043325 | A1 | 3/2004 | Shibuya et al. |

FOREIGN PATENT DOCUMENTS

| EP | 1 203 659 A2 | 5/2002 |
| WO | WO 01/42856 A2 | 6/2001 |

* cited by examiner

*Primary Examiner*—Richard L. Schilling
(74) *Attorney, Agent, or Firm*—Carmody & Torrance LLP

(57) ABSTRACT

An improved digitally imageable relief printing element having an increased direct-cure imaging speed upon exposure to lasers and other digital sources of actinic radiation. The printing elements of the invention comprise a reflective layer beneath a photosensitive resin layer so that instead of being absorbed by the reflective layer, photons of actinic radiation are reflected back up into the photosensitive layer, thereby speeding up the curing rate of the printing element.

11 Claims, No Drawings

HIGHLY REFLECTIVE SUBSTRATES FOR THE DIGITAL PROCESSING OF PHOTOPOLYMER PRINTING PLATES

This application is a continuation of application Ser. No. 10/462,977, filed Jun. 16, 2003, now Pat. No. 7,005,232.

FIELD OF THE INVENTION

This invention relates to an improved digitally imageable relief printing elements having an increased direct-cure imaging speed upon exposure to lasers and other digital sources of actinic radiation.

BACKGROUND OF THE INVENTION

Flexographic printing is widely used in the production of newspapers and in the decorative printing of packaging media. In flexographic printing, a layer of a flexible printing medium is deposited onto a flexible substrate such as a thin sheet of steel, aluminum, or synthetic polymer, to form a printing plate or a printing sleeve. A relief pattern corresponding to the negative image to be printed is formed in the printing medium. The plate is then mounted on the printing press, and printing commences.

In the manufacture of flexographic printing plates, photosensitive printing material is coated onto the substrate to form the printing plate or printing sleeve. The coated side is exposed with light to form a negative of the image to be printed, causing photopolymerization of the exposed portion of the printing medium, which then becomes physically hardened and resistant to solvent removal. The unexposed and therefore unhardened portion of the printing medium is removed by washing with solvent, leaving a relief pattern of the image to be printed. The printing plate is mounted on a press and printing commences.

Non-flexographic printing plates such as letterpress plates are also used for printing newspapers, shoppers, and books. Photosensitive resin compositions have been developed for use with non-flexographic printing applications for the same reasons disclosed above for flexographic applications. The use of photosensitive printing media for the manufacture of letterpress printing plates is essentially the same as for flexographic printing applications.

Direct cure refers to an imaging approach wherein the photopolymer of the plate (or other printing element) absorbs some of the actinic radiation causing a chemical reaction that polymerizes (i.e., cures) the photopolymer, rendering it insoluble in the washout solvent. Coherent energy, i.e., actinic radiation, is directed onto the surface of the photosensitive matrix in the desired pattern.

Various means have been proposed to increase the direct-cure imaging speed of flexographic and letterpress printing elements upon exposure to lasers and other digital sources of actinic radiation. For example, efforts have been made to develop more highly reactive photosensitive resins. Such materials would be expected to give more complete photoreaction (e.g., crosslinking, dissolution of crosslink bonds, rearrangement, and the like), even with brief laser exposures, as the desired image is scanned onto the photosensitive resin. One such reactive photosensitive resin system can be found in U.S. Pat. No. 5,976,763 to Roberts et al., the subject matter of which is herein incorporated by reference in its entirety.

Other efforts have focused on enhancing the imagewise exposure of a photosensitive material by using an apparatus that subjects photosensitive materials to a relatively low energy pre-exposure using the electromagnetic energy during the non-imaging portion of the exposure process (i.e., a backscan beam exposure) prior to subjecting the photosensitive materials to the main imaging exposure (i.e., an imagewise exposure). This concept is discussed in U.S. Pat. No. 6,262,825 to Mueller et al., the subject matter of which is herein incorporated by reference in its entirety. However, this process requires two exposure steps, thus increasing the time needed to process the photosensitive materials.

The inventors of the instant invention have found that the use of a highly reflective layer beneath the photosensitive resin layer can greatly enhance the imaging speed of photopolymer relief printing plates, while maintaining good resolution, when image-wise exposed using digital sources of actinic radiation. Instead of being absorbed by the reflective layer, the photons of actinic radiation are reflected back up into the photopolymer where they speed up the curing of the printing element.

While reflective layers have not previously been contemplated for use in flexographic or letterpress relief image printing elements, they have been suggested for use in other processes.

For example, highly reflective substrates have been proposed for use in producing image-receiving elements. U.S. Pat. No. 5,380,695 to Chiang et al., the subject matter of which is herein incorporated by reference in its entirety, disclose an image-receiving element comprising a support, wherein the support may comprise transparent, opaque or translucent material, with reflective (opaque) supports being preferred for the production of identification documents where image date is viewed against an opaque background. There is no suggestion in Chiang et al. that the reflective supports can be used in producing relief image printing plates.

Likewise, U.S. Pat. Nos. 5,468,540 and 5,670,096 to Lu, the subject matter of which is herein incorporated by reference in its entirety, describe a reflectoreflective article used as a transparent overlay to protect documents from tampering. Again, there is no suggestion that the reflective layer can be used to produce relief image printing plates.

U.S. Pat. No. 5,636,572 to Williams et al., the subject matter of which is herein incorporated by reference in its entirety, describes a surface layer below the IR-sensitive layer for reflecting IR radiation back into the IR-sensitive layer in order to increase net energy absorption and decrease laser power requirements. However, the invention described by Williams is directed to lithographic printing plates and is concerned with reflecting IR radiation back into the IR-sensitive layer, instead of the actinic radiation contemplated by the inventors of the present invention.

The inventors of the present invention have found that the benefit of high substrate reflectivity is particular to the imaging of plates with digital sources where the actinic radiation is substantially coherent, i.e., "high brightness." Conventional exposure systems, which have non-coherent sources of actinic radiation, can actually be harmed by highly reflective substrates due to the substantial scatter of the reflected radiation into non-image areas. The harmful effect of high substrate reflectivity is discussed in U.S. Pat. No. 4,622,088 to Min, the subject matter of which is herein incorporated by reference in its entirety. Min describes that when highly reflective supports are used, oblique rays passing through clear areas in the image-bearing transparency will strike the surface of the base at an angle other than 90° and after reflection, will cause polymerization in the non-image areas. Min teaches that this disadvantage can be overcome when the photopolymer layer is on a radiation-reflective support by an intervening stratum sufficiently absorptive of actinic radiation so that less than 35% of the incident radiation is reflected. The layer absorptive of reflected radiation or nonradiation scatter layer or antihalation layer, can be made by dispersing a finely-divided dye or pigment which substantially absorbs actinic radiation in a solution or aqueous dispersion of a resin or polymer which is adherent to both the support and the photoinsolubilized image and coating it on the support to form an anchor layer which is dried. This concept is discussed also in U.S. Pat. No. 4,460,675 to Gruetzmacher et al. and U.S. Pat. No. 4,423,135 to Chen et al., the subject matter of which is herein incorporated by reference in its entirety.

Furthermore, U.S. Pat. No. 6,037,101 to Telser et al., the subject matter of which is herein incorporated by reference in its entirety discloses a photosensitive recording material wherein if highly reflective panels or sheets are used as the substrate, the reflective panels or sheets contain suitable antihalation agents, such as carbon black or manganese oxide. In the alternative, the antihalation agents can be applied as a separate layer to the substrate or may be present in the adhesion-promoting layer or in the photopolymer layer.

Thus, there is a clear need in the art for methods that will enhance the "imagewise" exposure sensitivity of photosensitive materials, thereby permitting photoimaging to proceed as rapidly as possible, allowing for the rapid conversion of the photosensitive materials into finished articles. Furthermore, there remains a need to for a digitally imageable flexographic relief printing element that can provide an increased direct-cure imaging speed upon exposure to coherent sources of actinic radiation.

SUMMARY OF THE INVENTION

The current invention proposes an improved digitally imageable relief printing element having an increased direct-cure imaging speed upon exposure to lasers and other digital sources of actinic radiation comprising a reflective layer, at least one photocurable layer on top of said reflective layer, and optionally, a removable coversheet on top of the at least one photocurable layer, wherein said printing element is imaged using a digital source of actinic radiation.

Also contemplated by the present invention is a method of increasing the direct-cure imaging speed of a digitally imageable relief printing element, comprising the steps of providing a photocurable relief printing element comprising a reflective layer, at least one photocurable layer on top of the reflective layer, and optionally, a removable coversheet on top of said at least one photocurable layer, and exposing said photocurable relief printing element to a source of actinic radiation to directly cure the photocurable relief printing element.

The printing elements of the invention comprise a reflective layer beneath a photosensitive resin layer so that instead of being absorbed by the reflective layer, photons of actinic radiation are reflected back up into the photosensitive layer, thereby speeding up the curing rate of the printing element.

DETAILED DESCRIPTION OF THE PREFERRED EMBODIMENTS OF THE INVENTION

The inventors have found that the use of highly reflective substrates can greatly enhance the imaging speed of photosensitive relief printing elements, while maintaining good resolution, when image-wise exposed using digital sources of actinic radiation. Instead of being absorbed by the reflective layer, the photons of actinic radiation are reflected back up into the photosensitive layer where they speed up the curing of the printing element.

Direct-cure refers to an imaging approach wherein the photopolymer in the printing element absorbs some of the actinic radiation, causing a chemical reaction that polymerizes, or cures, the photopolymer, rendering it insoluble in the washout solvent that follows. Coherent energy, i.e., actinic radiation, is directed onto the surface of the photosensitive matrix in the desired pattern.

Photosensitive materials contemplated for use in the practice of the present invention include letterpress printing plates, flexographic printing plates, and the like. The printing elements are useful in a variety of printing applications including newspapers, inserts, directors, packaging, preprint liners, tags and labels, etc.

The chemistry of the photopolymer resin can be any type, including for example (meth)acrylate-based resins (see, for example, U.S. Pat, No. 5,348,844, which is herein incorporated by reference in its entirety), thiolene-based resins (see, for example, U.S. Pat. No. 3,783,152, which is herein incorporated by reference in its entirety), vinyl ether-based resins (see, for example, U.S. Pat. No. 5,446,073, which is herein incorporated by reference in its entirety), cationic-based resins (see, for example, U.S. Pat. No. 5,437,964, which is herein incorporated by reference in its entirety), diazonium-based resins (see, for example, U.S. Pat. No. 4,263,392, which is herein incorporated by reference in its entirety), and the like, as well as suitable combinations of any two or more thereof.

The photosensitive materials of the invention can have varying thicknesses, depending on the end use contemplated for such photosensitive materials. For example, for letterpress printing applications, the thickness of the photosensitive material can vary in the range from about 5 mils to about 50 mils, with a preferred range from about 10 mils to about 30 mils. For flexographic printing applications, the thickness of the photosensitive material can vary in the range from about 8 mils to about 250 mils, with a preferred range from about 100 mils to about 120 mils.

Printing elements of the invention can contain a single layer or a multi-layer of a photoimageable photosensitive resin on top of a highly reflective layer, and may optionally include a protective coversheet. The printing elements can take the shape of a sheet or a cylinder, and can be formed by extrusion, lamination, or casting. These techniques can readily be carried out by those skilled in the art.

Printing elements of the invention generally have a relief thickness of about 0.5 microns up to about 800 microns, preferably from 300 to about 500 microns, and are processable using water, solvent, or thermal blotting techniques, depending on the particular chemistry of the photosensitive resin system.

In order to produce the relief printing plates of the instant invention, the photosensitive resin material is subjected to a coherent beam of electromagnetic energy, in the spectral range to which the photosensitive material is reactive, to conditions sufficient to generate, from the coherent beam, an imaging beam capable of causing reaction of the photosensitive material.

The benefit of using highly reflective layers (substrates) is particular to the imaging of plates with digital sources where the actinic radiation is substantially coherent, i.e., "high brightness." Conventional exposure systems, which have non-coherent sources of actinic radiation, can actually be harmed by highly reflective substrates due to the substantial scatter of the reflected radiation into non-image areas. As previously discussed, in conventional exposure systems, an intervening stratum or other means must be used to prevent harmful effects of a highly reflective layer.

The inventors have found beneficial results in the practice of the invention by using substrates with greater than 40 percent reflectivity at the wavelength(s) emitted by the actinic source where the photoinitiator has an absorption. Preferably, substrates with greater than 60 percent reflectivity at the wavelength emitted by the actinic source where the photoinitiator are used. The reflectance of the substrate can be diffuse or specular (i.e., mirror-like). Preferably, the reflectance of the substrate is more specular.

High reflectivity can be imparted to the reflective layer in a variety of ways. For example, the support can be inherently reflective, wherein the support is made from aluminum, zinc and/or tin. Another means of imparting high reflectivity is by applying a reflective metal coating to the surface of the support by means of vacuum deposition or the like, wherein a layer of aluminum, tin, zinc and/or silver is deposited onto a metal or plastic support. If one of these methods is used to impart high reflectivity, a clear primer layer may optionally be used on top of the reflective substrate or reflective layer for purposes of adhering the support to the photopolymerizable layer or for other reasons known to those skilled in the art.

Another means of imparting high reflectivity is through the use of highly reflective pigments such as aluminum, mica, and/or bismuth, which can be formulated into a primer coating and coated onto a metal or plastic support. The highly reflective primers contemplated for use in the invention may be aqueous-based, solvent-based, TV-curable, or powder coated primers. The primers can be applied by means of Meyer bars, roll coating, curtain coating, extrusion, spraying, or slot dies. Other methods would also be known to one skilled in the art.

The source of actinic radiation can be either a laser or a non-laser. Non-limiting examples of lasers usable in the invention include sources capable of providing coherent electromagnetic energy of suitable energy to promote imaging of photosensitive materials via reflection or refraction of the electromagnetic energy, e.g., ion gas lasers (e.g., argon ion lasers, krypton lasers, helium:cadmium lasers, and the like), solid state lasers (e.g., Nd:YAG, frequency-doubled Nd:YAG lasers, and the like), semiconductor diode lasers, molecular gas lasers (e.g., carbon dioxide lasers, and the like), and the like, and suitable combinations of two or more thereof. Such laser sources are generally capable of emitting electromagnetic energy in the spectral range to which the photosensitive material is reactive. Further, the electromagnetic energy emitted by the laser source is capable of operating as an imaging beam to directly write image data onto the photosensitive material. Non-limiting examples of non-laser sources include plasma lamps, xenon lamps, mercury lamps, and carbon arc lamps.

The preferred wavelength of the source of actinic radiation is from 250 to 500 nanometers, preferably from 320 to 420 nanometers. Preferred wavelengths are those which correspond to the spectral sensitivity of the photoinitiator being employed.

The invention will now be described by reference to the following non-limiting examples:

INVENTION EXAMPLE 1

Primer mixing: In the order given, 50.00 parts of NeoRez R-966 polyurethane aqueous dispersion (Zeneca Resins Inc), 25.00 parts of QW18-1 polyurethane resin (K. J. Quinn & Co), 0.50 parts of Silwet L-7600 polydimethylsiloxane (Osi Specialties Inc), 0.25 parts of Silquest A-187 silane (Osi Specialties Inc), 7.75 parts of deionized water, and 0.50 parts of Nopco DSX-1550 (Henkel Corp) were mixed at room temperature for 15 minutes. 16.00 parts of BiFlair 83S bismuth pigment (EM Industries) was added and mixed for an additional 15 minutes.

Substrate coating: A length of 0.0066 inch thick tin-free steel was pretreated by sequentially washing with 0.1 N aqueous sodium hydroxide and deionized water, then dried with hot air. The primer composition was applied via roll-coating to the cleaned steel to a wet thickness of 25–40 microns. The sheet was dried at 400 F for 75 seconds. The average percent reflectance of the coated substrate was measured to be 66% over the wavelength range of 340–390 nm on a Shimadzu UV-2102 PC UV/Vis spectrophotometer equipped with ISR-260 integrating sphere.

Resin mixing: Part A: 7.63 parts of Kraton D1107 block copolymer (Kraton Chemical Co) was dissolved in 6.36 parts of lauryl acrylate (Sartomer Co) by stirring at 45° C. for one hour. Part B: 10.17 parts of polyoxyalkylene mono-phenyl ether (Dai-Ichi Kogyo Seiyaku Co. Ltd.), 5.92 parts of Dabco XDM (Air Products Inc), 6.36 parts of polyethylene glycol diacrylate (SR-344 by Sartomer Co) and 7.63 parts of ethoxylated trimethylolpropane triacrylate (SR-499 by Sartomer Co) were blended together. Added to Part B next were 0.25 parts of butylated hydroxy toluene (Sherex Chemical Inc), 1.32 parts of 1-hydroxycyclohexyl phenyl ketone (Irgacure 184 by Ciba), 0.26 parts of diphenyl (2,4,6-trimethylbenzyl) phosphine oxide (Lucerin TPO by BASF Corporation), and 0.20 parts of zinc diacrylate (SR-705 by Sartomer Co).

53.90 parts of particulate emulsion copolymer composed of butadiene/methacrylic acid/divinylbenzene/methacrylate (TA906 by JSR Corporation, see EP 0 607 962 A1, U.S. Pat. No. 6,140,017), 13.99 parts of Part A and 32.11 parts of Part B were mixed in a Moriyama Mixer (Model D3-7.5 Moriyama Mfg Works, Ltd.) at 80 C. Part B was introduced to the mixer in seven separate and equal aliquots. The resin was mixed until homogeneous.

Plate making: The photosensitive resin described above was passed through a single screw extruder and sheet die at approximately 80 C to apply a 15 mil thick layer onto a length of pre-coated substrate.

Plate exposing and processing: The entire plate was pre-sensitized with an overall bump exposure. The dose of bump exposure used is determined empirically because it varies depending on the resin formula. The preferred bump exposure is 90% of the maximum exposure possible before the appearance of photopolymer residue on the plate processed under normal processing conditions. After the bump exposure, the plate was image-wise exposed with an Innova 300 argon ion UV laser (Coherent Inc) at an exposure level necessary to hold a 3% highlight dot on a 100 lines per inch halftone screen. The imaging beam had a $1/e^2$ spot diameter at the plate surface of approximately 25 microns and a full angle beam divergence of approximately 10 milli-radians.

The imaged plate was then processed in a NAPPflex FP-II processor (NAPP Systems Inc.) using deionized water at 140 F., a spray pressure of 850 psi, and a conveyor speed of 28 inches per minute. The plate made in Invention Example 1 required an imaging exposure of 42 mj/cm$^2$ in order to hold the targeted 3% highlight dot. See Table 1.

INVENTION EXAMPLE 2

Primer mixing procedure: In the order given, 50.00 parts of NeoRez R-966 polyurethane aqueous dispersion (Zeneca Resins), 15.50 parts of MP4983R/40R copolymer emulsion (Michelman Inc), 0.30 parts of Nopco DSX-1550 (Henkel Corp), 0.70 parts of Silwet L-7600 polydimethylsiloxane (Osi Specialties Inc) and 25.50 parts of deionized water were mixed for 15 minutes at room temperature. 8.0 parts of Aquavex 1752-207S aluminium pigment (Silberline) was added and mixed a further 15 minutes.

Substrate coating: The same procedure was used as shown in Example 1. The average percent reflectance of the coated substrate was measured to be 73% over the wavelength range of 340–390 nm on a Shimadzu UV-2102 PC UV/Vis spectrophotometer equipped with ISR-260 integrating sphere.

Plate making: The same procedure was used as shown in Example 1. The plate made in Invention Example 2 required an imaging exposure of 35 mj/cm2 in order to hold the targeted 3% highlight dot. See Table 1.

INVENTION EXAMPLE 3

Primer mixing procedure: In the order given, 45.00 parts of NeoRez R-966 polyurethane dispersion (Zeneca Resins), 2.50 parts of Alcogum SL-76 acrylic emulsion (National Starch & Chemical), 1.6 parts of sodium hydroxide, 50.4 parts of deionized water and 0.50 parts of Surfynol 440 surfactant (Air Products & Chemical Inc) were mixed at room temperature for 15 minutes.

Substrate coating: The same procedure was used as shown in Example 1 except that a sheet of 10 mil thick aluminum was used as the substrate. The average percent reflectance of the coated substrate was measured to be 75% over the wavelength range of 340–390 nm on a Shimadzu UV-2102 PC UV/Vis spectrophotometer equipped with ISR-260 integrating sphere.

Plate making: The same procedure was used as shown in Example 1. The plate made in Invention Example 3 required an imaging exposure of 35 mj/cm$^2$ in order to hold the targeted 3% highlight dot. See Table 1.

COMPARATIVE EXAMPLE 4

Primer mixing: The same primer and procedure was used as shown in Example 3. Substrate coating: The same metal and procedure was used as shown in Invention Example 1. The average percent reflectance of the coated substrate was measured to be 34% over the wavelength range of 340-390 nm on a Shimadzu UV-2102 PC UV/Vis spectrophotometer equipped with ISR-260 integrating sphere.

Plate making: The same procedure was used as shown in Invention Example 1. The plate made in Comparative Example 4 required an imaging exposure of 70 mj/cm$^2$ in order to hold the targeted 3% highlight dot. This plate could not be imaged nearly as rapidly as those in the invention examples. See Table 1.

TABLE 1

| | Average % Reflectance @ 340–390 nm | Exposure Dose to hold 3% dot at 100 lpi screen (mj/cm$^2$) |
|---|---|---|
| INVENTION EXAMPLE 1 | 66 | 42 |
| INVENTION EXAMPLE 2 | 73 | 35 |
| INVENTION EXAMPLE 3 | 75 | 35 |
| COMPARATIVE EXAMPLE 4 | 34 | 70 |

The invention claimed is:

1. A method of direct curing a relief printing element with a source of actinic radiation, comprising the steps of:
   a. providing a photocurable relief printing element comprising:
      i. a reflective layer which reflective layer has a reflectivity of at least 40 percent at the wavelength(s) emitted by the source of actinic radiation;
      ii. at least one photocurable layer on top of said reflective layer, and
      iii. optionally, a removable coversheet on top of said at least one photocurable layer; and
   b. exposing said photocurable relief printing element to the source of actinic radiation to directly cure the photocurable relief printing element;
   where the source of actinic radiation comprises a laser such that at least 40 percent of the actinic radiation hitting the reflective layer is reflected back into the photocurable layer, thereby curing the photocurable layer.

2. A method according to claim 1, wherein the photocurable layer comprises a photopolymer and a photoinitiator.

3. A method according to claim 1, wherein the reflective layer has a reflectivity of at least 60 percent at the wavelength emitted by the actinic source and at least 60 percent of the actinic radiation hitting the reflective layer is reflected back into the photocurable layer thereby curing the photocurable layer.

4. A method according to claim 1, wherein the source of actinic radiation is a laser selected from the group consisting of ion gas lasers, solid state lasers, semiconductor diode lasers, molecular gas lasers, and combinations of the foregoing.

5. A method according to claim 1, wherein the source of actinic radiation has a wavelength between about 250 nanometers and about 500 nanometers.

6. A method according to claim 1, wherein the source of actinic radiation has a wavelength between about 320 nanometers and about 420 nanometers.

7. A method according to claim 1, wherein the reflective layer is selected from the group consisting of a reflective support and reflective coating on a support.

8. A method according to claim 7, wherein the reflective layer is a reflective support selected from the group consisting of aluminum, zinc, tin and mixtures of the foregoing.

9. A method according to claim 7, wherein the reflective layer is a reflective coating on a support and the reflective coating is selected from the group consisting of aluminum, tin, zinc, silver, and mixtures of the foregoing, deposited onto the support by means of vacuum deposition.

10. A method according to claim 9, wherein the support is selected from the group consisting of metal and plastic supports.

11. A method according to claim 1, wherein said printing element is selected from the group consisting of flexographic printing elemnts and offset printing elements.

* * * * *

UNITED STATES PATENT AND TRADEMARK OFFICE
CERTIFICATE OF CORRECTION

| | | |
|---|---|---|
| PATENT NO. | : 7,083,896 B2 | Page 1 of 1 |
| APPLICATION NO. | : 11/267435 | |
| DATED | : August 1, 2006 | |
| INVENTOR(S) | : David Roberts et al. | |

It is certified that error appears in the above-identified patent and that said Letters Patent is hereby corrected as shown below:

Column 8

Line 65, delete "elemonts," and replace it with --elements--

Signed and Sealed this

Twenty-first Day of November, 2006

JON W. DUDAS
*Director of the United States Patent and Trademark Office*